United States Patent
Bauer et al.

(10) Patent No.: US 7,692,283 B2
(45) Date of Patent: Apr. 6, 2010

(54) DEVICE INCLUDING A HOUSING FOR A SEMICONDUCTOR CHIP INCLUDING LEADS EXTENDING INTO THE HOUSING

(75) Inventors: Michael Bauer, Nittendorf (DE);
Holger Woerner, Regensburg (DE);
Simon Jerebic, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 53 days.

(21) Appl. No.: 11/938,658

(22) Filed: Nov. 12, 2007

(65) Prior Publication Data

US 2009/0102044 A1 Apr. 23, 2009

(30) Foreign Application Priority Data

Oct. 23, 2007 (DE) .................. 10 2007 050 608

(51) Int. Cl.
*H01L 23/48* (2006.01)
*H01L 23/52* (2006.01)
*H01L 23/495* (2006.01)

(52) U.S. Cl. ............ 257/690; 257/666; 257/676; 257/692; 257/693; 257/E23.031; 257/E23.052; 257/E23.066

(58) Field of Classification Search .......... 257/666, 257/676, E23.031, E23.052, E23.066, 690, 257/692–693
See application file for complete search history.

(56) References Cited

U.S. PATENT DOCUMENTS

| | | | |
|---|---|---|---|
| 5,506,446 A * | 4/1996 | Hoffman et al. | 257/674 |
| 5,530,284 A * | 6/1996 | Bailey | 257/670 |
| 6,255,135 B1 * | 7/2001 | Barrow | 438/106 |
| 6,787,889 B2 * | 9/2004 | Schoenfeld | 257/666 |
| 2003/0038358 A1 | 2/2003 | Chiu et al. | |
| 2004/0099931 A1 | 5/2004 | Huang et al. | |
| 2005/0121777 A1 * | 6/2005 | Hata et al. | 257/713 |
| 2005/0127385 A1 * | 6/2005 | Reeh et al. | 257/98 |
| 2005/0129989 A1 * | 6/2005 | Edwards | 429/7 |
| 2006/0017141 A1 * | 1/2006 | Luo et al. | 257/666 |
| 2007/0024173 A1 * | 2/2007 | Braune | 313/485 |
| 2007/0068779 A1 * | 3/2007 | Baldo et al. | 200/16 R |
| 2007/0080361 A1 * | 4/2007 | Malm | 257/99 |
| 2007/0131957 A1 * | 6/2007 | Brunner et al. | 257/99 |
| 2007/0200219 A1 * | 8/2007 | Otremba | 257/692 |
| 2008/0116551 A1 * | 5/2008 | Ferstl et al. | 257/678 |
| 2008/0191328 A1 * | 8/2008 | Kobayakawa | 257/676 |
| 2008/0203548 A1 * | 8/2008 | Sun et al. | 257/672 |
| 2008/0265266 A1 * | 10/2008 | Bogner et al. | 257/98 |
| 2008/0284008 A1 * | 11/2008 | Urushihata | 257/735 |
| 2009/0001535 A1 * | 1/2009 | Heng et al. | 257/676 |
| 2009/0268084 A1 * | 10/2009 | Kametani et al. | 348/370 |

* cited by examiner

*Primary Examiner*—Ida M Soward
(74) *Attorney, Agent, or Firm*—Dicke, Billig & Czaja, PLLC

(57) ABSTRACT

A device including a housing for a semiconductor chip is disclosed. One embodiment provides a plurality of leads. A first lead forms an external contact element at a first housing side and extends at the first housing side into the housing in the direction of an opposite second housing side. The length of the first lead within the housing is greater than half the distance between the first and the second housing side.

17 Claims, 5 Drawing Sheets

DEVICE INCLUDING A HOUSING FOR A SEMICONDUCTOR CHIP INCLUDING LEADS EXTENDING INTO THE HOUSING

CROSS-REFERENCE TO RELATED APPLICATIONS

This Utility Patent Application claims priority to German Patent Application No. DE 10 2007 050 608.4 filed on Oct. 23, 2007, which is incorporated herein by reference.

BACKGROUND

The present invention relates to a device including a housing for a semiconductor chip, a component, a method for producing a housing for a semiconductor chip, and a method for producing a component.

A housing for a semiconductor chip is conventionally produced by a semiconductor chip and electrical leads that are to be connected to electrical contact elements of the semiconductor chip being arranged relative to one another in a specific manner and being surrounded by a material such as a potting or molding compound, which can subsequently be cured. Outside the housing the leads form external contact elements with which the housing can be electrically contact-connected elsewhere, for instance on a circuit board.

It has been illustrated that particularly in the case of specific types of housings such as very small or thin housings, e.g., the PSSO (Plastic Single Small Outline) housings, problems can occur on account of the construction. It can happen, for example, that the embedding into the molding compound, i.e. in one embodiment the distance between the bonding wires and a closest point of the molding compound surface at the bending side is only approximately 0.8 mm. Since the bonding wires in these housings are therefore embedded into the molding compound only inadequately, delaminations and wire cracks can occur in the event of mechanical stresses such as flexures.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various example embodiments described herein may be combined with each other, unless specifically noted otherwise.

Housings for semiconductor chips, components containing semiconductor chips, methods for producing housings for semiconductor chips, and methods for producing components containing semiconductor chips are described below. In this case, the invention is independent of the type of semiconductor chips. Semiconductor chips can be any type of components or chips on a semiconductor basis. In one embodiment, the components can be electrical, electromechanical and/or electro-optical components, e.g., integrated circuits, sensors, microelectromechanical components (MEMS) or laser diodes and the like.

The housing can have a material such as a potting compound with which the leads are surrounded. The material can contain or include for example a resin such as an epoxy resin or the like. The material can also have some other composition. Stated generally, the material can have any conceivable composition that can form a potting or encapsulating compound with which the semiconductor chip can be surrounded.

The semiconductor chip can have contact elements or contact pads on one or more of its outer surfaces, wherein the contact elements serve for making electrical contact with the semiconductor chip. The contact elements can be produced from any electrically conductive material, e.g., from a metal such as aluminium, gold, or copper, or a metal alloy, or an electrically conductive organic material, or an electrically conductive semiconductor material.

Figure 1:
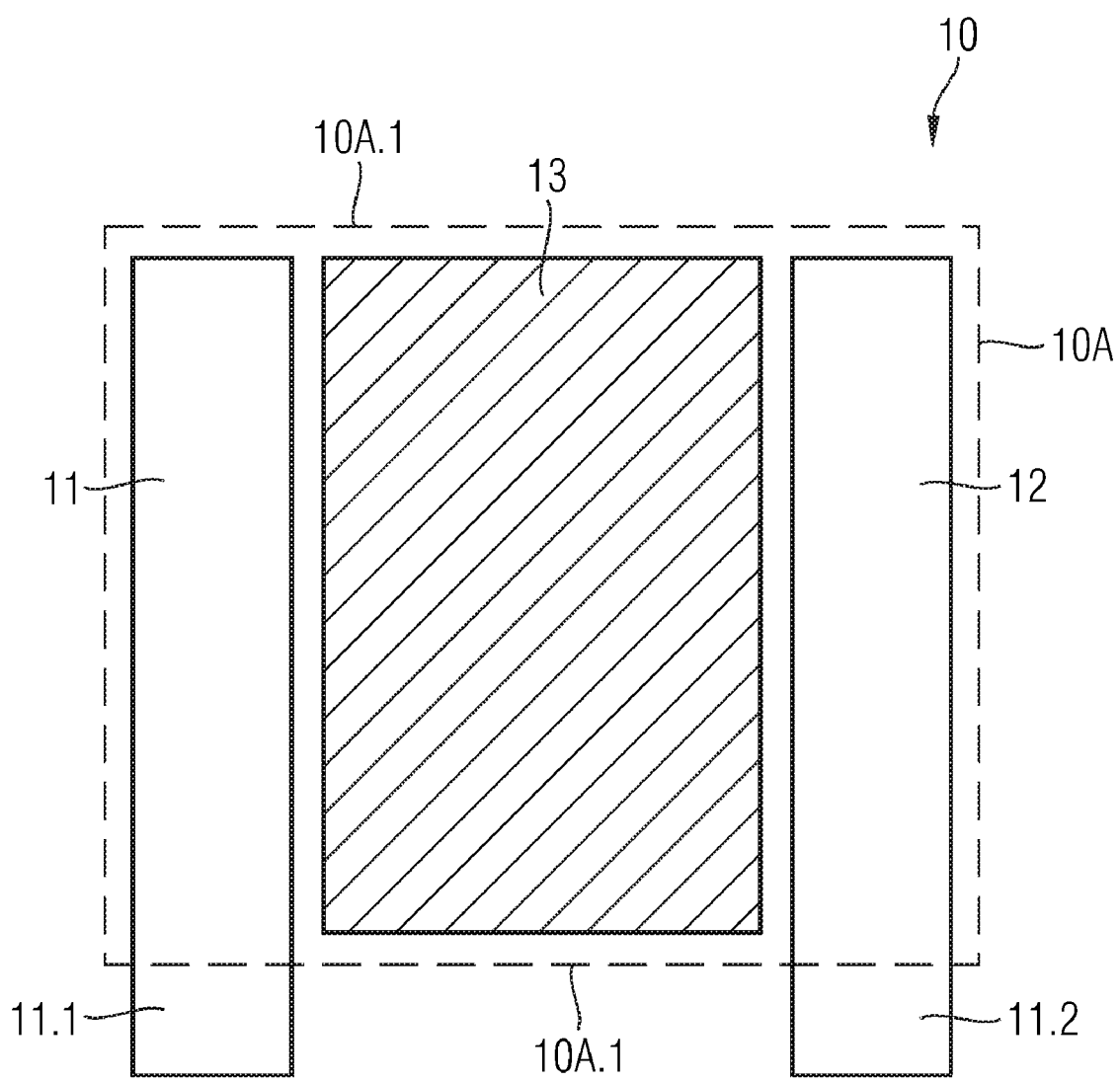
FIG. 1 illustrates a schematic illustration of one embodiment of a device including a housing in a plan view.

FIG. 1 illustrates one embodiment of a device including a housing for a semiconductor chip schematically in a plan view. The housing includes:

a plurality of leads 11 and 12, wherein a first lead 11 forms an external contact element 11.1 at a first housing side and extends at the first housing side into the housing 10 in the direction of an opposite second housing side, wherein the length of the first lead 11 within the housing 10 is greater than half the distance between the first and the second housing side.

The housing 10 is provided by a molding or potting compound produced in a suitable casting mould and has an outer boundary 10A, which is illustrated by dashed lines and is provided by outer boundary walls of the molding compound. A first boundary wall 10A.1 represents a first housing side, while a second boundary wall 10A.2 represents a second housing side.

The housing 10 furthermore has the first lead 11 and a second lead 12. The first lead 11 and the second lead 12 extend from the first housing side, at which they respectively form external contact elements 11.1 and 12.1, parallel to one another into the housing 10. Both leads 11 and 12 in each case extend within the housing 10 from the first housing side in the direction of the opposite second housing side, wherein within the housing 10 they in each case have a length greater than half the distance between the first housing side and the second housing side.

It can also be provided, however, that only one of the two leads 11 and 12 has the above criteria, i.e. in one embodiment has a length within the housing that is greater than half the distance between the first housing side and the second housing side, particularly if the risk of damage as a result of bonding wires being torn away in the event of mechanical loading of the housing is intended to be reduced only with regard to this one lead. The respective other leads can then also correspond to other configurations.

What is achieved by the configuration and arrangement of the two leads 11 and 12 relative to the housing 10, in one embodiment by their length within the housing 10, is that they are anchored sufficiently and well in the housing 10 and with the housing 10. It is thus possible to reduce the risk of damage such as the tearing away of bonding wires connected to the leads on account of mechanical stresses of the housing 10 such as warpages or the like. In the case of PSSO housings, it is possible to achieve in one embodiment an embedding of the bonding wires of 2.0 mm or more, as will be illustrated further below.

If a plurality of leads are used as in the example embodiment of FIG. 1, then they can have the same form and the same dimensions and be produced from one and the same electrically conductive material, as in the example embodiment. This may be the case for example when the leads have emerged from one and the same leadframe and have been separated from one another in the course of the manufacturing process. However, it can also be provided that the leads do not have the same form and the same dimensions and they also need not necessarily be produced from one and the same electrically conductive material. In one embodiment, it is not necessary for the leads to extend parallel to one another.

The housing 10 can furthermore contain a carrier 13, to which a semiconductor chip can be applied. In this case, the carrier 13 can be arranged between the first lead 11 and the second lead 12, as illustrated. Furthermore, as illustrated, the carrier 13 can have a rectangular base area, the side lengths of which are in each case greater than the width of the leads 11 and 12. The semiconductor chip to be applied to the carrier 13 generally likewise has a rectangular base area, the dimensions of which can correspond to the rectangular base area of the carrier 13, such that the semiconductor chip is then spaced apart laterally from the leads 11 and 12 in the plan view. However, the base area of the semiconductor chip can also have dimensions deviating from the base area of the carrier 13, as will be seen in a further example embodiment. The base area of the semiconductor chip can have in one embodiment larger dimensions than the base area of the carrier 13, such that the semiconductor chip projects laterally beyond the carrier 13 in the plan view, as will likewise be able to seen in a further example embodiment.

The carrier 13 can furthermore be produced from an electrically conductive material. In one embodiment, the leads 11 and 12 and the carrier 13 may have been produced from a leadframe, as will likewise be able to seen on the basis of a further example embodiment.

However, the carrier 13 can also be produced from an electrically insulating material, particularly if its sole function is to consist in providing a receptacle area for the semiconductor chip and in carrying the semiconductor chip.

If the carrier 13 is produced from an electrically conductive material or at least its surface facing the semiconductor chip is provided with an electrically conductive material, the semiconductor chip can be electrically contact-connected to the carrier 13 by using one or more electrical contact elements applied on a surface of the semiconductor chip that faces the carrier 13. The semiconductor chip can, moreover, be electrically connected to the leads by using contact elements applied on its surface remote from the carrier, as will likewise be able to be seen on the basis of an example embodiment.

However, it may equally be provided that no carrier is provided, and that only leads such as the leads 11 and 12 illustrated in the example embodiment of FIG. 1 are present in the housing. In this case, the semiconductor chip can be applied on the leads and be carried by the latter.

Figure 2:
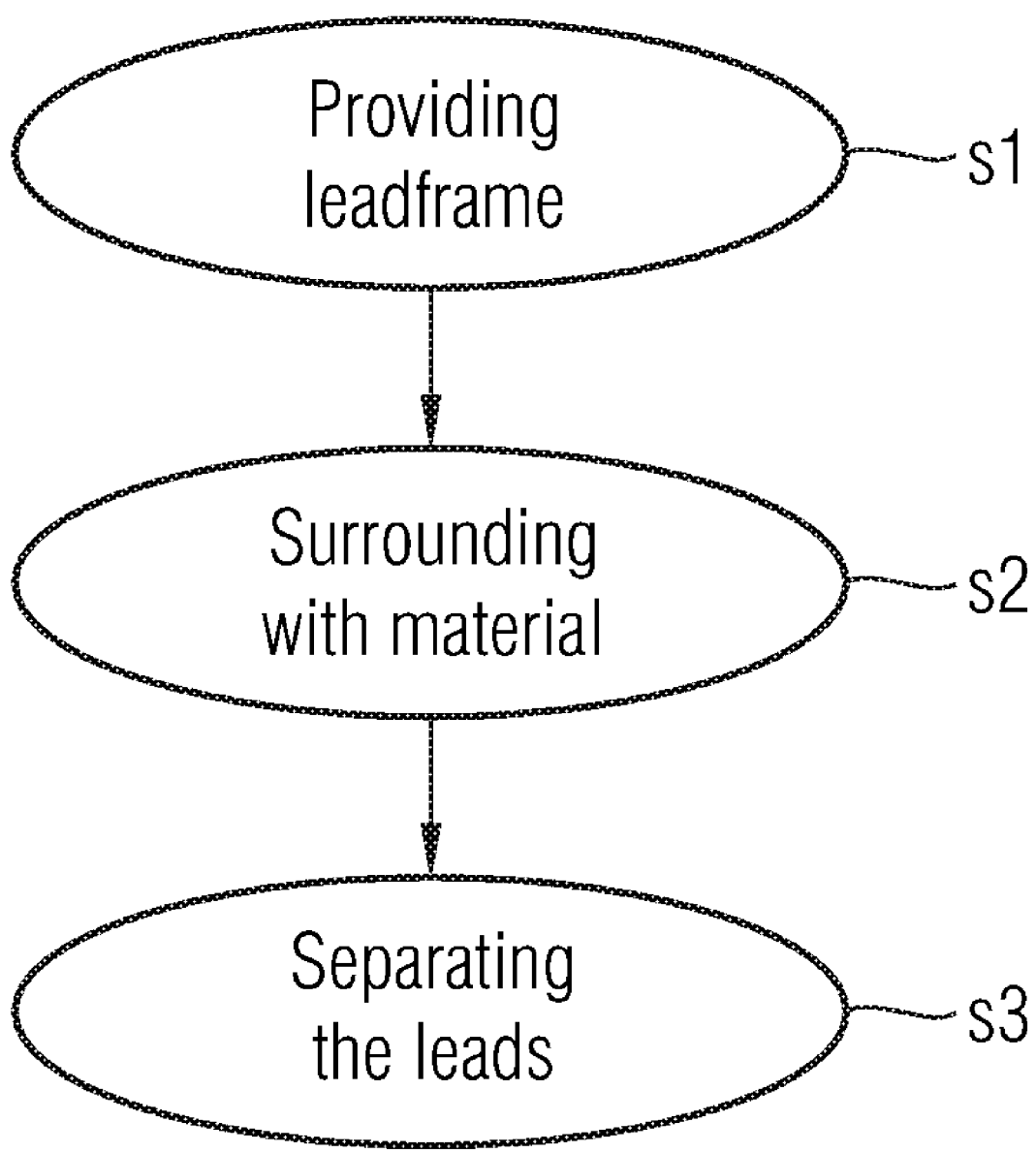
FIG. 2 illustrates a flow chart for illustrating one embodiment of a method for producing a housing for a semiconductor chip.

FIG. 2 illustrates a flow chart of one embodiment of a method for producing a housing for a semiconductor chip.

The production method proceeds from a suitably configured leadframe, which is separated into individual components in the course of the production process. The leadframe is an initially continuous structure in which the leads are contained and connected to one another, for example by narrow webs.

The method specifically includes providing a leadframe having a plurality of leads (s1), surrounding the leadframe with a material, in one embodiment a potting compound (s2), and separating the leads from one another (s3), wherein a first lead forms an external contact element at a first housing side and extends at the first housing side into the housing in the direction of an opposite second housing side, wherein the length of the first lead within the housing is greater than half the distance between the first and the second housing side.

The method specified above can be used for example to produce a housing as illustrated in FIG. 1 and described further above. In this case, the leadframe contains not only the leads 11 and 12 but also the carrier 13, on which a semiconductor chip can be applied. The leads 11, 12 and the carrier 13, as part of the continuous leadframe, can initially be connected to one another by narrow webs at the longitudinal sides of the leads 11, 12 and of the carrier 13. The webs can be separated after a first encapsulation by injection molding or casting operation with the potting compound, such that the leads 11, 12 are separated from the carrier 13 situated between them. This can then be followed by one or more further encapsulation by injection molding operations in order to produce the housing. In this case, the encapsulation by injection molding operations are carried out in such a way that a first lead 11 forms an external contact element 11.1 at a first housing side and extends at the first housing side into the housing 10 in the direction of an opposite second housing side, wherein the length of the first lead 11 within the housing 10 is greater than half the distance between the first and the second housing side.

Figure 3:
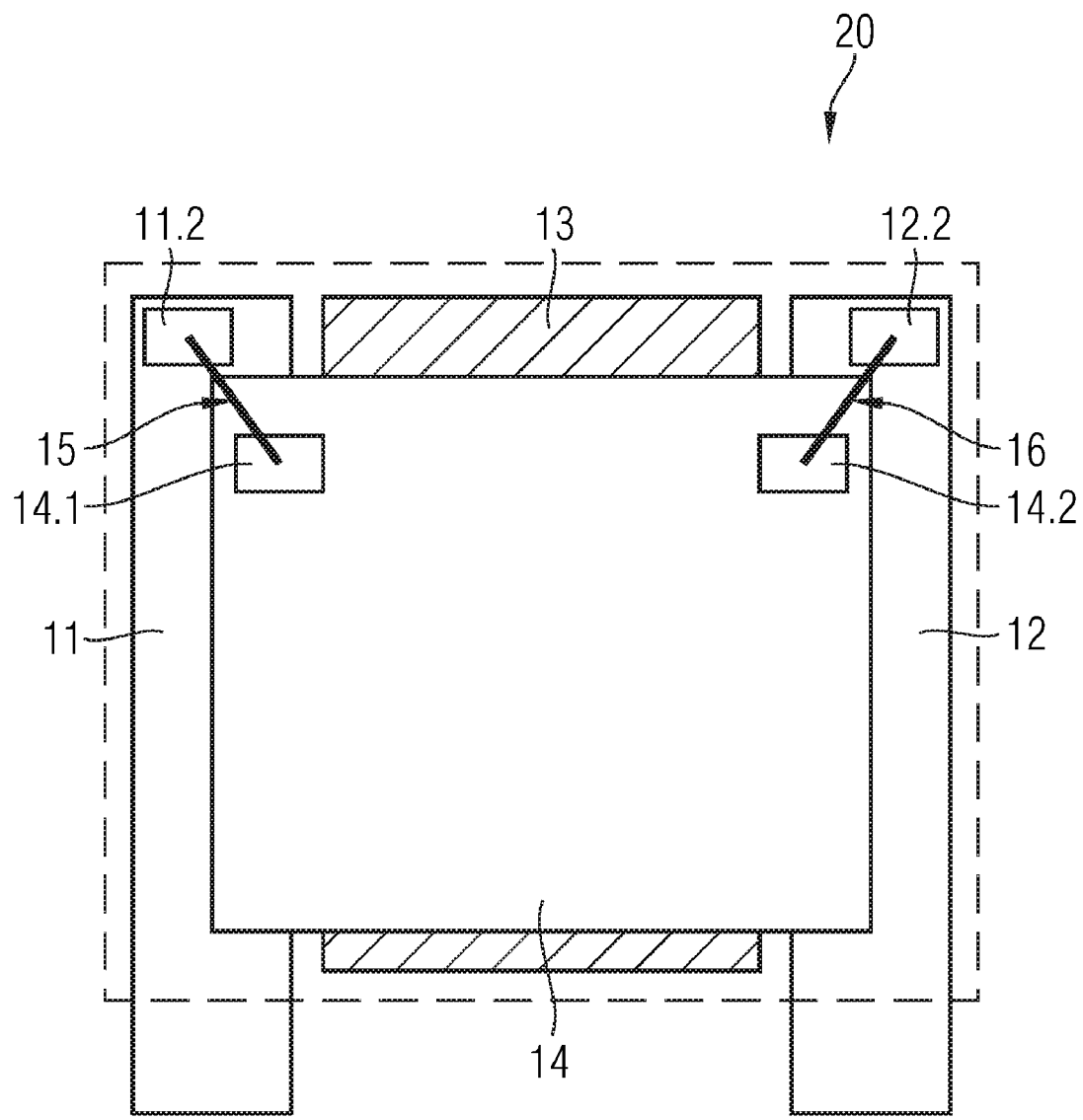
FIG. 3 illustrates a schematic illustration of one embodiment of a component in a plan view.

FIG. 3 illustrates one embodiment of a component schematically in a plan view. The component 20 in FIG. 3 can emerge for example from a housing 10 such as is illustrated in the embodiment in FIG. 1, elements that are identical or identical in terms of their effect being designated by identical reference numerals.

The component 20 essentially has a housing 10, a semiconductor chip 14, a plurality of leads 11 and 12, wherein a first lead 11 forms an external contact element 11.1 at a first housing side and extends at the first housing side into the housing 10 in the direction of a second housing side, wherein the semiconductor chip 14 has a first contact element 14.1 on one surface, the contact element being electrically connected to a section 11.2 of the first lead 11 by using a wire 15, such as a bonding wire 15 for instance, wherein the first contact element 14.1 and the section 11.2 of the first lead 11 lie nearer to the second housing side than to the first housing side.

In this case, it may be provided that, as illustrated in the example embodiment in FIG. 3, the length of the first lead 11 within the housing 10 is greater than half the distance between the first and the second housing side.

The second lead 12 is likewise electrically connected to the semiconductor chip 14 by using a wire 16 such as a bonding wire 16. For this purpose, a second contact element 14.2 is present on the surface of the semiconductor chip 14, the bonding wire 16 being connected to the contact element. The bonding wire 16 is furthermore connected to a section 12.2 of the second lead 12. The sections 11.2 and 12.2 of the leads 11 and 12 are only surface regions of the respective leads 11 and 12 which do not differ otherwise, i.e. structurally, from the remaining surface regions of the leads 11 and 12.

The leads 11 and 12 project from the housing 10 at the first housing side. Therefore, this region is particularly at risk with regard to delamination and wire cracks on account of mechanical stress such as warpage of the leads or the like. The first housing side is therefore also referred to as the bending side. By virtue of the fact that the bonding wires 15 and 16 are arranged maximally far away from the molding compound surface at the bending side, such damage—such as wires being torn away—caused by mechanical stresses can be effectively avoided. This distance, which was also referred to as embedding further above, can be 2 mm or more.

Figure 4:
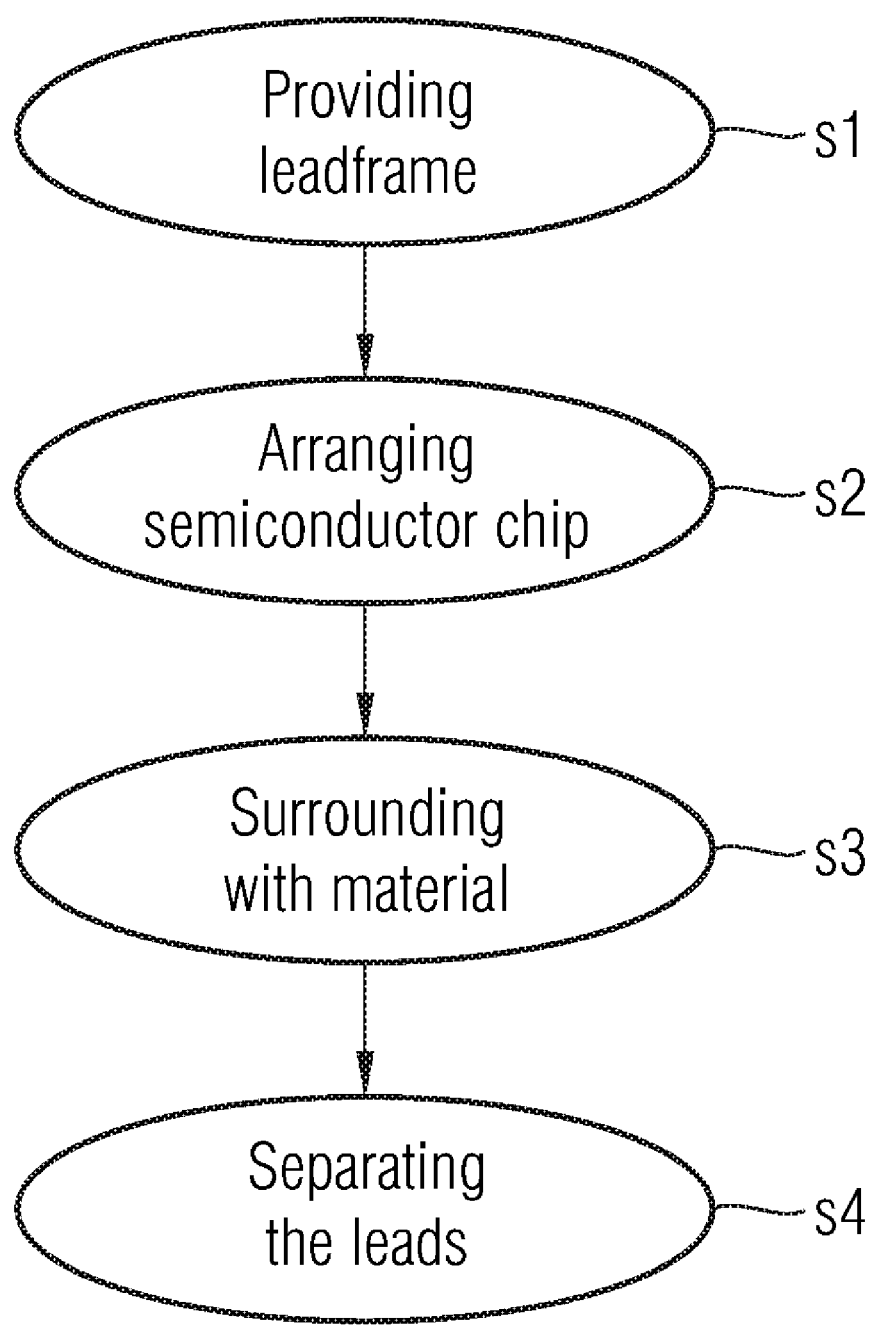
FIG. 4 illustrates a flow chart for illustrating one embodiment of a method for producing a component.

FIG. 4 illustrates a flow chart of one embodiment of a method for producing a component. The method is based on the method described with reference to FIG. 2, wherein, in addition, a semiconductor chip is arranged in the housing and a component housing and a semiconductor conductor chip mounted therein is thus produced.

The method includes providing a leadframe having a plurality of leads, arranging a semiconductor chip, which has an electrical contact element, within the boundaries of a housing to be formed, surrounding the leads and the semiconductor chip with a material, in one embodiment a potting compound, in such a way that a first lead forms an external contact element at a first housing side and extends at the first housing side into the housing in the direction of an opposite second housing side and the contact element lies nearer to the second housing side than to the first housing side, separating the leads from one another, and electrically connecting the contact element to the first lead by using a wire.

The method specified above can be used to produce for example a component as illustrated in FIG. 3 and described further above. In this case, the leadframe contains not only the leads 11 and 12 but also the carrier 13, on which the semiconductor chip 14 is applied. The remaining method measures can be carried out analogously to the method for producing a housing as described with reference to FIG. 2.

It may furthermore be provided that the semiconductor chip 14 is at least partly applied on one or more of the leads, for example the first lead 11, as illustrated in the example embodiment of a produced component in accordance with FIG. 3.

In the course of the production process, the contact elements 14.1 and 14.2 situated on the upper surface of the semiconductor chip 14 are electrically connected to the leads 11 and 12 at sections 11.2 and 12.2 provided for them. This can be done, e.g., at a point in time when a first encapsulation by injection molding or casting operation has already taken place, the individual components of the leadframe have been separated from one another and the semiconductor chip 14 has been applied to the carrier 13. As already mentioned, the wires 15, and 16 can be bonding wires made of gold, for example, which are produced by customary bonding methods. Afterwards, a further encapsulation by injection molding or casting operation can be carried out, by using which the semiconductor chip 14 can be covered with the potting compound.

Figure 5:
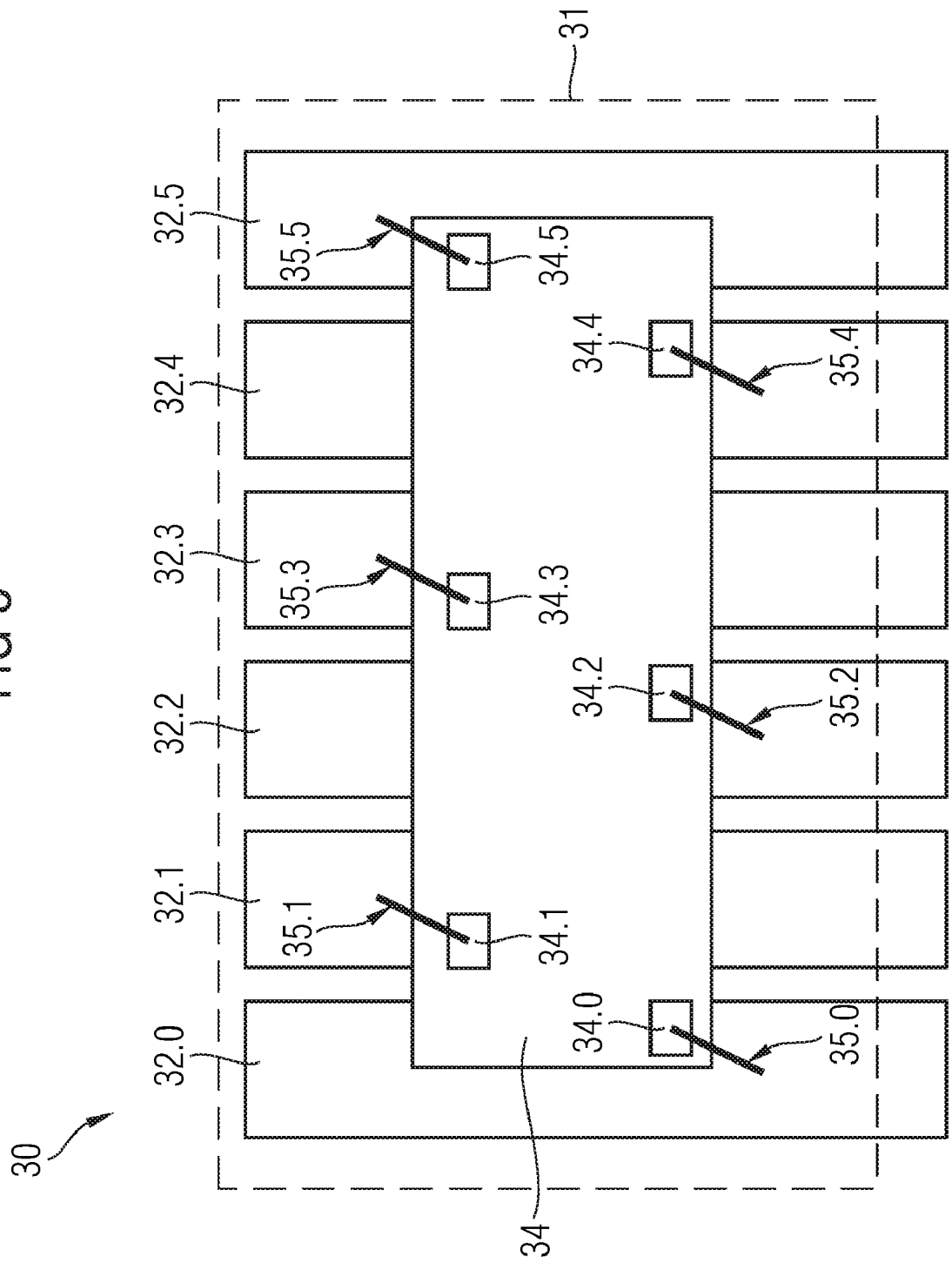
FIG. 5 illustrates a schematic illustration of one embodiment of a further component in a plan view.

FIG. 5 schematically illustrates one embodiment of a further component in a plan view.

The component 30 illustrated in FIG. 5 essentially includes a housing 31, a semiconductor chip 34, and a plurality of leads 32.n, wherein a first lead 32.1 forms an external contact element 32.11 at a first housing side and extends in the direction of a second housing side, wherein the first lead 32.1 extends at least partly below the semiconductor chip 34.

In this case, as provided in the example embodiment in FIG. 5, the first lead 32.1 can extend, along a part of its length, laterally completely below the semiconductor chip 34.

It may furthermore be provided, as likewise provided in the example embodiment in FIG. 5, that two or more leads in each case extend at least partly or completely below the semiconductor chip 34. In the example embodiment, the four leads 32.1, 32.2, 32.3 and 32.4 in each case run over a part of their length completely below the semiconductor chip 34. The outermost leads 32.0 and 32.5 run only partly below the semiconductor chip 34.

It may furthermore be provided, as likewise provided in the example embodiment in FIG. 5, that at least the first lead 32.1 has within the housing 31 a length that is longer than half the distance between the first housing side and the second housing side. This holds true for all the leads 32.0 to 32.5 in the present example embodiment in FIG. 5.

As in the example embodiment, the semiconductor chip 34 can be oriented in such a way that its longitudinal axis lies in a transverse direction with respect to the longitudinal axis of the first lead 32.1 or the longitudinal axes of all the leads 32.0 to 32.5.

The semiconductor chip 34 can furthermore have a plurality of contact elements 34.0 to 34.5 on its upper surface. These contact elements 34.0 to 34.5 can be connected to a respective one of the leads 32.0 to 32.5 by using bonding wires 35.0 to 35.5. In this case, it may be provided that the contact elements 34.0 to 34.5 are alternately arranged either at or in the vicinity of an upper longitudinal edge of the semiconductor chip 34 or at or in the vicinity of a lower longitudinal edge of the semiconductor chip 34.

A method for producing a component such as, for example, the component in accordance with the embodiment of FIG. 5 specifically includes providing a leadframe having a plurality of leads, arranging a semiconductor chip within the boundaries of a housing to be formed, surrounding the leadframe with a material, in one embodiment a potting compound, and separating the leads from one another, wherein a first lead forms an external contact element at a first housing side and extends at the first housing side into the housing in the direction of an opposite second housing side, and wherein the first lead extends at least partly below the semiconductor chip.

The method can be developed in accordance with the above-specified developments of the component according to FIG. 5. In one embodiment, in one method measure, the contact elements 34.0 to 34.5 can be connected to the leads 32.0 to 32.5 by using bonding wires 35.0 to 35.5 using known bonding methods.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A device including a housing, comprising:
   a semiconductor chip comprising a first main surface and a second main surface opposite the first main surface; and
   a plurality of leads; wherein
   a first lead forms an external contact element at a first housing side and extends at the first housing side into the housing in the direction of an opposite second housing side; wherein
   the length of the first lead within the housing is greater than half the distance between the first and the second housing side; wherein
   the first main surface is adjacent to the first lead and the second main surface is remote from the first lead; and wherein
   the first main surface is electrically disconnected from the first lead.

2. The device of claim 1, wherein the housing has a material including a potting compound surrounding the leads.

3. The device of claim 2, wherein the second main surface of the semiconductor chip is electrically connected to the first lead by a wire.

4. The device of claim 3, wherein the semiconductor chip has an electrical contact element on the second main surface, the wire being electrically connected to the contact element; and wherein
   the contact element lies nearer to the second housing side than to the first housing side.

5. The device of claim 1, wherein the housing comprises a plastic single small outline housing.

6. A component, comprising:
   a housing;
   a semiconductor chip; and
   a plurality of leads; wherein
   a first lead forms an external contact element at a first housing side and extends at the first housing side into the housing in the direction of a second housing side; wherein
   the semiconductor chip has an electrical contact element on one surface, the contact element being electrically connected to a contact point on the first lead by using a wire; and wherein
   the contact point on the first lead lies nearer to the second housing side than to the first housing side.

7. The component of claim 6, wherein the length of the first lead within the housing is greater than half the distance between the first and the second housing side.

8. The component of claim 6, wherein the semiconductor chip is at least partly applied on the first lead.

9. The component of claim 6, further comprising a carrier, on which the semiconductor chip is applied.

10. The component of claim 9, wherein the carrier is arranged between the first lead and a second lead, wherein in particular the first lead and the second lead are oriented parallel to one another.

11. The component of claim 6, wherein the housing comprises a plastic single small outline housing.

12. A component, comprising:
    a housing;
    a semiconductor chip; and
    a plurality of leads; wherein
    a first lead forms a first external contact element at a first housing side and extends in the direction of a second housing side, wherein a second lead forms a second external contact element at the first housing side and extends in the direction of the second housing side; wherein
    the first and the second lead at least partially cover a first main surface of the semiconductor chip; and wherein
    the first and the second lead are electrically connected to a second main surface of the semiconductor chip.

13. The component of claim 12, wherein the first lead extends, along a part of its length, laterally completely below the semiconductor chip.

14. The component of claim 12, wherein two or more leads in each case extend at least partly below the semiconductor chip.

15. The component of claim 14, wherein two or more leads in each case extend, along a part of their length, laterally completely below the semiconductor chip.

16. The component of claim 14, wherein the length of the first lead within the housing is greater than half the distance between the first and the second housing side.

17. The component of claim 12, wherein the housing comprises a plastic single small outline housing.

* * * * *